United States Patent
Schierenbeck et al.

(10) Patent No.: US 11,593,537 B2
(45) Date of Patent: Feb. 28, 2023

(54) METHOD OF PLANNING A PLATFORM LIFT

(71) Applicant: TK Elevator Innovation and Operations GmbH, Duesseldorf (DE)

(72) Inventors: Andreas Schierenbeck, Ratingen (DE); Thomas Felis, Seattle, WA (US); Francisco Javier Sesma Sanchez, Gijón (ES); Jie Xu, Brookhaven, GA (US); Pieter-Bas De Kleer, Voorburg (NL); Jonatan Hernandez Alvarez, Oviedo (ES); Ana Belén Quiroga Sánchez, Oviedo (ES); Marcos Pérez Pérez, Oviedo (ES)

(73) Assignee: TK Elevator Innovation And Operations GmbH, Essen (DE)

(*) Notice: Subject to any disclaimer, the term of this patent is extended or adjusted under 35 U.S.C. 154(b) by 648 days.

(21) Appl. No.: 16/606,109

(22) PCT Filed: Apr. 19, 2018

(86) PCT No.: PCT/EP2018/060044
§ 371 (c)(1),
(2) Date: Oct. 17, 2019

(87) PCT Pub. No.: WO2018/193034
PCT Pub. Date: Oct. 25, 2018

(65) Prior Publication Data
US 2020/0242284 A1 Jul. 30, 2020

Related U.S. Application Data

(60) Provisional application No. 62/487,624, filed on Apr. 20, 2017.

(51) Int. Cl.
*G06F 30/17* (2020.01)
*B66B 9/08* (2006.01)
*B66B 19/00* (2006.01)

(52) U.S. Cl.
CPC ............. *G06F 30/17* (2020.01); *B66B 9/08* (2013.01); *B66B 19/00* (2013.01)

(58) Field of Classification Search
CPC .......... G06F 30/00; G06F 30/17; B66B 9/08; B66B 19/00
(Continued)

(56) References Cited

U.S. PATENT DOCUMENTS

| 4,882,846 A | 11/1989 | Reed |
| 2009/0056245 A1 | 3/2009 | Miller |

FOREIGN PATENT DOCUMENTS

| CN | 102538684 B | 8/2014 |
| EP | 1 554 210 A | 7/2005 |

(Continued)

OTHER PUBLICATIONS

English Translation of International Search Report issued in PCT/EP2018/060044, dated Jul. 23, 2018.

*Primary Examiner* — Cedric Johnson
(74) *Attorney, Agent, or Firm* — Dinsmore & Shohl LLP

(57) ABSTRACT

A method of planning a platform lift. The platform lift includes a rail, platform, chair, and a drive unit attached to the platform to drive the platform along the rail. The method includes acquiring 3D-data of a stair on which the platform lift is to be installed utilizing an augmented reality device. Calculating a travel path of the rail is based on acquired 3D-data and predetermined clearance information. Visualizing part or all of the platform lift is based on the calculated path of travel via the augmented reality device. Acquiring the 3D-data includes observing the stair with the augmented (Continued)

reality device; marking several locations and confirming the locations via a user input; extracting surface information via a computer based analysis of the markings and optical information taken by the augmented reality device. Based on the optical information and predetermined clearance information the path of travel is calculated.

11 Claims, 5 Drawing Sheets

(58) Field of Classification Search
USPC .......................................................... 703/7, 6
See application file for complete search history.

(56) References Cited

FOREIGN PATENT DOCUMENTS

| WO | 2004/037703 A | 5/2004 | |
|----|----|----|----|
| WO | 2013/129923 A | 9/2013 | |
| WO | 2013/137733 A | 9/2013 | |
| WO | WO-2013137733 A1 * | 9/2013 | ............. B66B 19/00 |
| WO | 2015/052489 A | 4/2015 | |
| WO | WO-2015052489 A1 * | 4/2015 | ........... B66B 9/0846 |
| WO | WO-2016124666 A1 * | 8/2016 | ............... B66B 9/08 |

* cited by examiner

METHOD OF PLANNING A PLATFORM LIFT

CROSS REFERENCE TO RELATED APPLICATIONS

This application is a U.S. National Stage Entry of International Patent Application Serial Number PCT/EP2018/060044, filed Apr. 19, 2018, which claims priority to U.S. Provisional Patent Application No. 62/487,624, filed Apr. 20, 2017, the entire contents of both of which are incorporated herein by reference.

FIELD

The present disclosure generally relates to a method of planning a platform lift.

BACKGROUND

The invention refers to a method of planning a platform lift, in particular a stairlift.

EP 1 554 210 A1 discloses a platform lift for the use of a disabled person in a wheelchair. WO 2013/129923 A1 discloses a platform lift in the form of a stairlift. In both cases the platform is part of a drive unit which travels along at least one guide rail. A leveling mechanism is provided to hold the platform always in a horizontal orientation, even if the inclination angle of the guide rail is changing along the path of travel. In particular the rail of such platform lifts has curved shape, like shown in FIG. 3 of WO 2015/052489 A1.

WO 2013/129923 A1 discloses a stairlift. The stairlift comprises a chair mounted on a drive assembly. The drive assembly travels along at least one guide rail. A leveling mechanism is provided to hold the chair always in a horizontal orientation, even if the inclination angle of the guide rail is changing.

In particular in small houses, where the stairs are narrow and/curved, the purchaser, which is later the user of the stairlift, cannot imagine, how the stairlift could fit into the stairs. It is often difficult to provide a real impression on the dimensions of the stairlift compared to the surrounding area of the stairlift merely from drawings or prospects. An additional problem is to deal with bottleneck areas or obstacles at the staircase.

Thus a need exists for a method of planning a platform lift, in particular a stairlift, at a stair, the platform lift comprising a rail, a platform, in particular a chair, a drive unit for driving the platform along the rail, the platform is attached to the drive unit.

In particular the method comprising the steps:

utilizing an augmented reality device;

acquiring 3D-data of a stair on which the platform lift is to be installed;

calculating based on the acquiring 3D-data and predetermined clearance information a path of travel of the rail;

visualizing at least parts (2, 6), in particular the rail (2) or the platform (6), of the platform lift (1) in accordance with the calculated path of travel (D) by means of the augmented reality device (13).

DETAILED DESCRIPTION

Figure 1A:
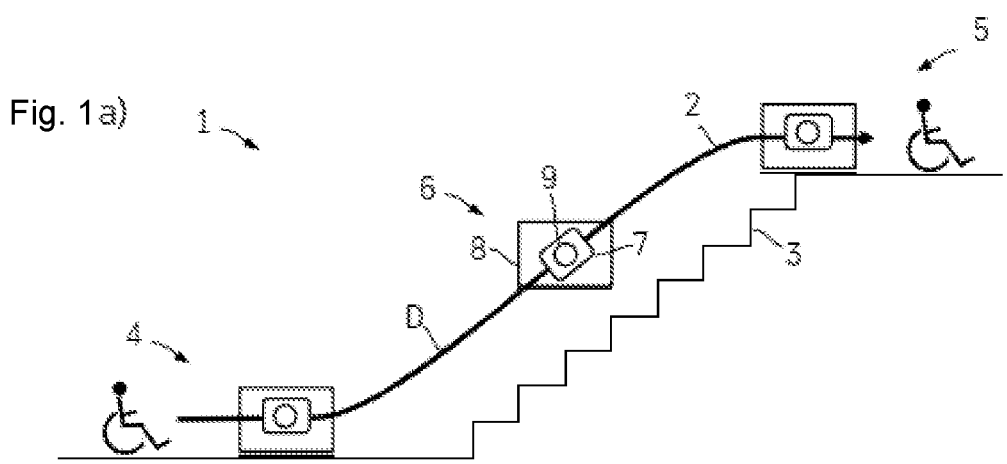
FIG. 1 is a side view of two conventional platform lifts.

Although certain example methods and apparatus have been described herein, the scope of coverage of this patent is not limited thereto. On the contrary, this patent covers all methods, apparatus, and articles of manufacture fairly falling within the scope of the appended claims either literally or under the doctrine of equivalents. Moreover, those having ordinary skill in the art will understand that reciting "a" element or "an" element in the appended claims does not restrict those claims to articles, apparatuses, systems, methods, or the like having only one of that element, even where other elements in the same claim or different claims are preceded by "at least one" or similar language. Similarly, it should be understood that the steps of any method claims need not necessarily be performed in the order in which they are recited, unless so required by the context of the claims. In addition, all references to one skilled in the art shall be understood to refer to one having ordinary skill in the art.

The invention refers to a method of planning a platform lift, in particular a stairlift.

Here the appearance of the parts of the platform lift can be simulated by means of the augmented reality device. The user can get a realistic visual impression of the appearance of the stairlift, without the need to install a prototype or similar. Also the overall effort of planning is reduced.

In particular the step acquiring 3D-data of the stair comprising the follow steps:

observing an area of the stair with the help of the augmented reality device;

marking a location of the stair, in particular with the help of a marker, thereby in particular confirming the location of the marking via a user input;

continue with subsequently marking several locations at the stairs;

extracting surface information via a computer based analysis on the markings and optical information taken by the augmented reality device; and based on the optical information and predetermined clearance information calculating the path of travel.

Here the path of travel, which constitutes the basis for all further visualizations, is calculated with the help of the extracted surface information. By marking several important or structures of the stairs are highlighted, which are relevant for extracting the relevant surface information.

In particular the platform, in particular a seat, is visualized along the calculated path by means of the augmented reality device. The user can now get an impression of the spatial condition, when a real platform is traveling along the real rail. Also for the planning important information can be obtained by the respective visualization.

In particular a passenger is visualized along the calculated path by means of the augmented reality device, in particular located on the visualized platform. Here a person sitting on the platform can be simulated; in particular large person can be visualized, which may have problems with obstacles during the course of travel. Therefore in particular the stature, in particular the magnitude, of the visualized person is adapted based on a user input.

In particular the platform and/or the person is/are visualized in various locations in accordance with the path of travel. Thereby Specific situations can be simulated. In particular the platform and or the person is/are visualized in various orientations at the same location of the path of travel, in particular swiveled around a vertical axis and/or tilted around a horizontal axis upon a user input. In particular a collision situation with a real obstacle and the visualization of parts of the platform lift or the visualization of the person is determined by bringing the visualization of parts of the platform lift or the visualization of the person in the zone of influence of the obstacle, wherein the visualization of parts of the platform lift or the visualization of the person is in accordance with the path of travel. Here a collision situation can be simulated. If the visualization shows a collision between the user or platform lift and a obstacle, a real collision of the real platform lift is likely. In this case a redesign of the rail can be briefly planned, avoiding extensive costs.

In particular for avoiding a collision between an obstacle and the visualization of parts of the platform lift or the visualization of the person, the visualization of the platform or of the user can be swiveled around a vertical axis and/or tilted around a horizontal axis upon a user input. By means of swiveling or tilting a collision can already be avoided. A redesign of the rail may become obsolete.

In particular a tilting angle or a swivel angle, which supports an avoidance of collision, is stored in a database in combination with a corresponding position along the path of travel. Later the real platform lift may be controlled with the help of the stored angle.

The object is further solved by a method for installing a platform lift, in particular a stairlift, at a stair, the platform lift comprising a method for planning as described above, wherein geometrical data of path of travel are used for manufacturing the rail.

In particular the method for installing a platform lift, in particular a stairlift, at a stair, the platform lift comprising a method for plaining as described above, wherein the stored tilting angle or stored swivel angle is used during programming a control unit of the platform lift for controlling the tilting swiveling the platform during use.

In this context the term "visualization" of elements of the platform lift or the "visualization" of the person in accordance with the path of travel" means: when viewed with the help of the augmented reality device a picture appears at a position, which is realistic when the platform travels along the path of travel. So the picture, which the user sees through the augmented reality device confirms widely with a real picture a user would see without the augmented reality device, if the lift would be installed base on the determined path of travel. So if the display shows a collision with an obstacle, then this collision would happen in the real world as well, when the chair would drive along the real rail.

Figure 1B:
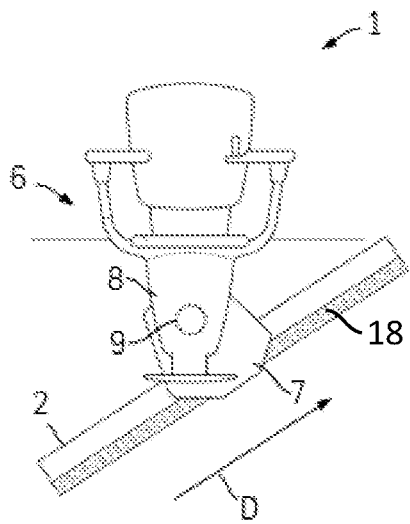

FIG. 1 shows two exemplary embodiments of a generic platform lift 1, to which the invention can be applied. In FIG. 1*a* a platform lift 1 for the use with a wheelchair is shown. The platform 8 therefore comprises a kind of lifting ramp, which can travel along a direction of travel D from a first landing area 4 to a second landing area 5. The direction of travel D is defined by a rail 2, and is limited in main by the course of an existing stairway 3 in a house. An alternative embodiment is shown in FIG. 1*b* wherein the platform 8 comprises a seat.

The rail 2 has a curved shape, which deviates from a straight line; thus the direction of travel will change at least once during the course of the rail 2.

The platform 8 is part of a drive unit 6, which further comprises a carrier 7. The carrier 7 has rollers (not shown in the drawing figures), which roll along the rail 2. For driving the carrier 7, positive engagements means 18 (only shown in detail in FIG. 1*b*) are provided on the rail 2, which cooperates with driving means, in particular a driven pinion (not shown), of the drive unit 6. A leveling mechanism 9 is provided on the drive unit 6 to keep the platform 8 always in a horizontal orientation, even if the inclination of the rail 2 varies during its course.

Figure 2A:
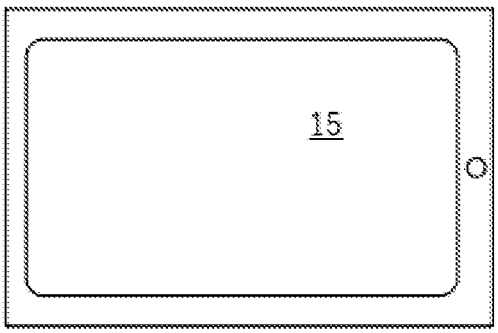
FIG. 2a is a front view of the augmented reality device in form of a tablet PC.
Figure 2B:
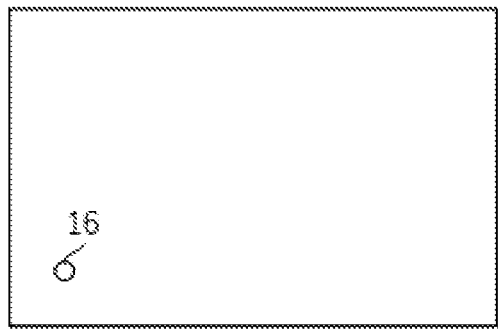
FIG. 2b is a rear view of the augmented reality device in form of a tablet PC.

FIG. 2 shows augmented reality device 13, here a tablet PC, which is used during the further course of the planning. However there are lot of other augmented reality devices possible for use within this application. The augmented reality device 13 comprise a display 15, on which a virtual reality visualization can be displayed. One or more cameras 16, and optionally an IR sensor, are provided for acquiring optical 3D-information of the field of view. The augmented reality device 13 comprises an integrated computer or is connected to an external computer.

Figure 3:
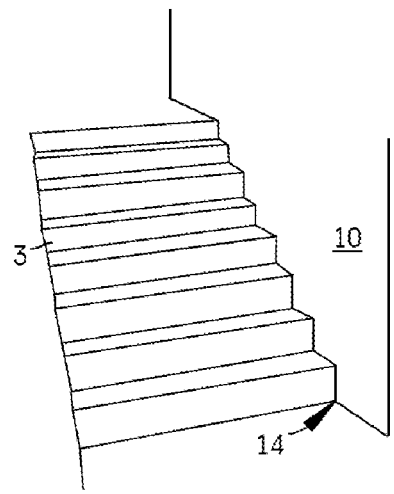
FIG. 3 is a view of a stair, at which a stair lift has to be installed.

FIG. 3 shows a stair 3 attached to a wall 10, on which the platform lift 1 is to be installed. In a first step the user takes a marker and marks a characteristic area of the stair, here a corner of the stair. Thereby the user confirms the position to be marked by a user input, e.g. by a spoken word, a confirmation gesture or a keyboard input, as it relates to the area of the stair The marker related to the stair may be any hardware device, the location and orientation of which may be captured electronically. Said marker may comprise any machine readable elements, e.g. a specific optical appearance and/or RF tags and/or orientation sensors, which may give a signal about its location and/or orientation to a sensor, in particular a camera or RF sensor.

Figure 4:
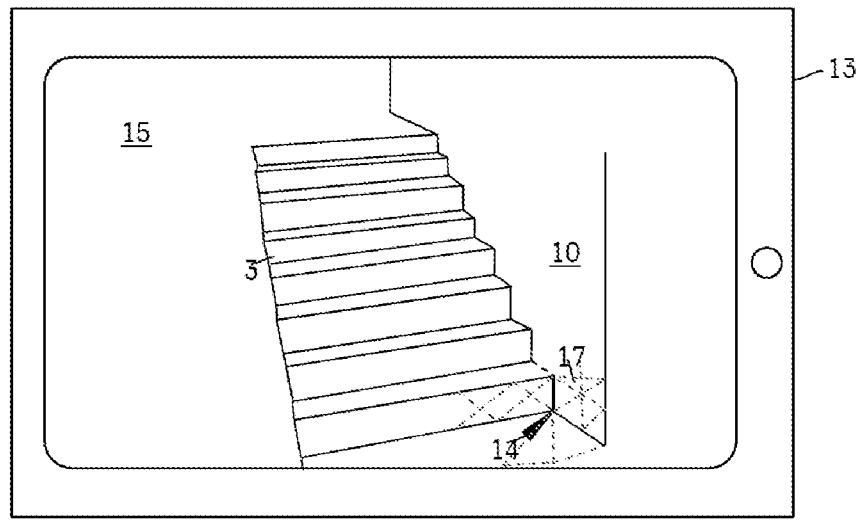
FIG. 4 is a view of the stair being watched with the help of the augmented reality device during marking with a marker.
Figure 5:
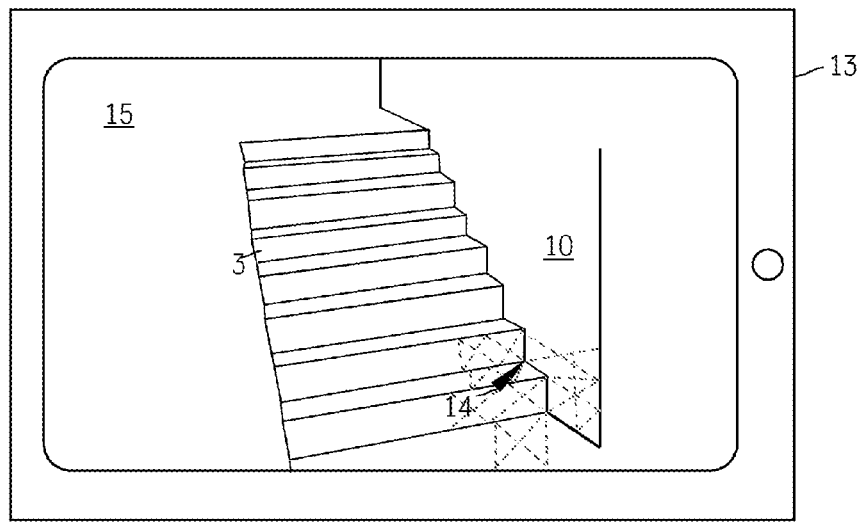
FIG. 5 is a view of the stair being watched with the help of the augmented reality device during marking with a marker.

Subsequently the computer analyses the information obtained in particular by sensors of the augmented reality device in the area of the marking and extracts spatial surface information of the observed area, here the stairs and the adjacent wall. The surface of the stairs and the wall is extracted and virtually provided with geometric triangles 17, so that the user can see, which surface is already observed and analyzed (FIG. 4). In FIG. 5 more surfaces are analyzed; thus more surfaces are virtually provided with triangles. In this manner the stair is to be completely analyzed.

The user has now the opportunity to decide, on which side of the stair 3 the rail 2 is to be arranged. In this example the user selects the right side. The computer now retrieves clearance parameters C from a database. This clearance parameters C contain e.g. minimum distances between the rail and an adjacent surface such as the wall 10 or the stair 3. Based on this parameters C the computer calculates the path of travel D. Subsequently a matching visualization of a rail 2 is added around to the path of travel D and is put out via the display 15.

Figure 6:
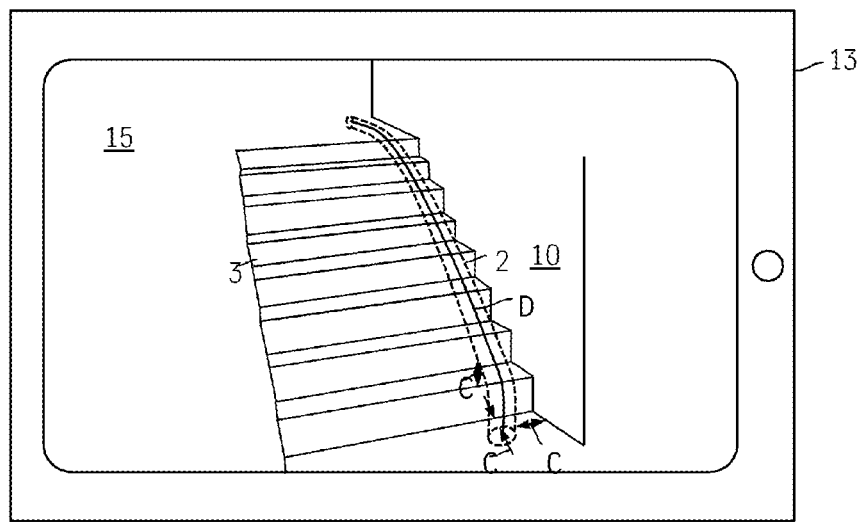
FIG. 6 is a visualization of a stairlift comprising a rail along the stairs.
Figure 7:
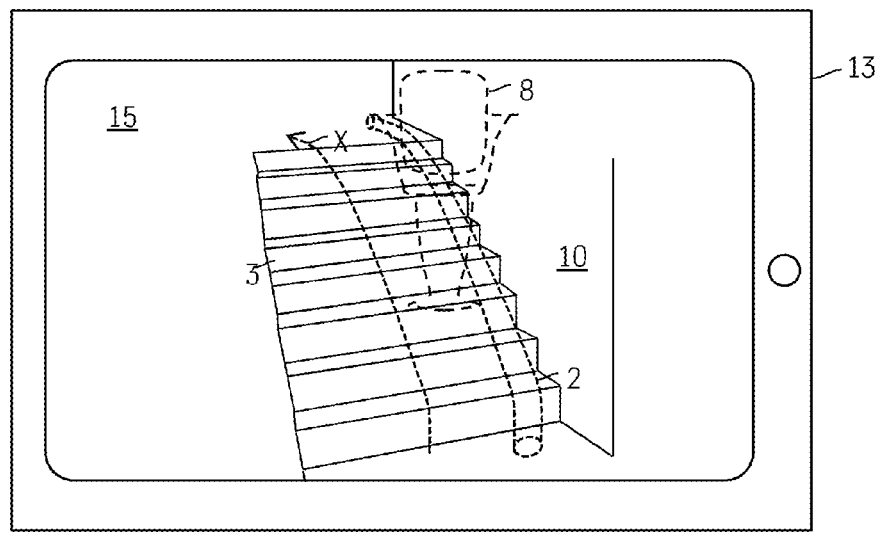
FIG. 7 is the visualization of FIG. 6 comprising a carrier and a chair.

Now the user sees on the display if the augmented reality device a picture of the real stairs 3 and a virtual rail 2 (FIG. 6). The user can now select, that a virtual platform 8 is added to the visualization (FIG. 7). Upon user input the virtual platform 8 can travel along the virtual rail 3. The purchaser can now get a virtual model of the stairlift which may provide a real impression.

Figure 8:
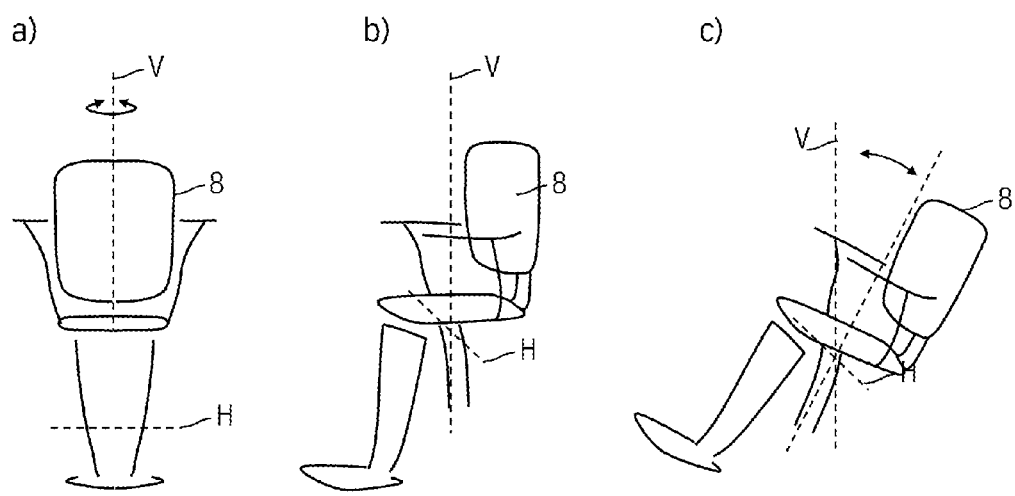
FIG. 8 is an isolated visualization of the chair in different orientations.

Upon user input the orientation of the platform virtual can be changed. So the virtual platform 8 may be swiveled around a vertical axis V (FIG. 8*a*) and/or may be tilted around a horizontal axis H (FIG. 8*a*), as a real chair of a chairlift can do, e.g. as described in European patent application 16 156 184.0 (not yet published).

Figure 9:
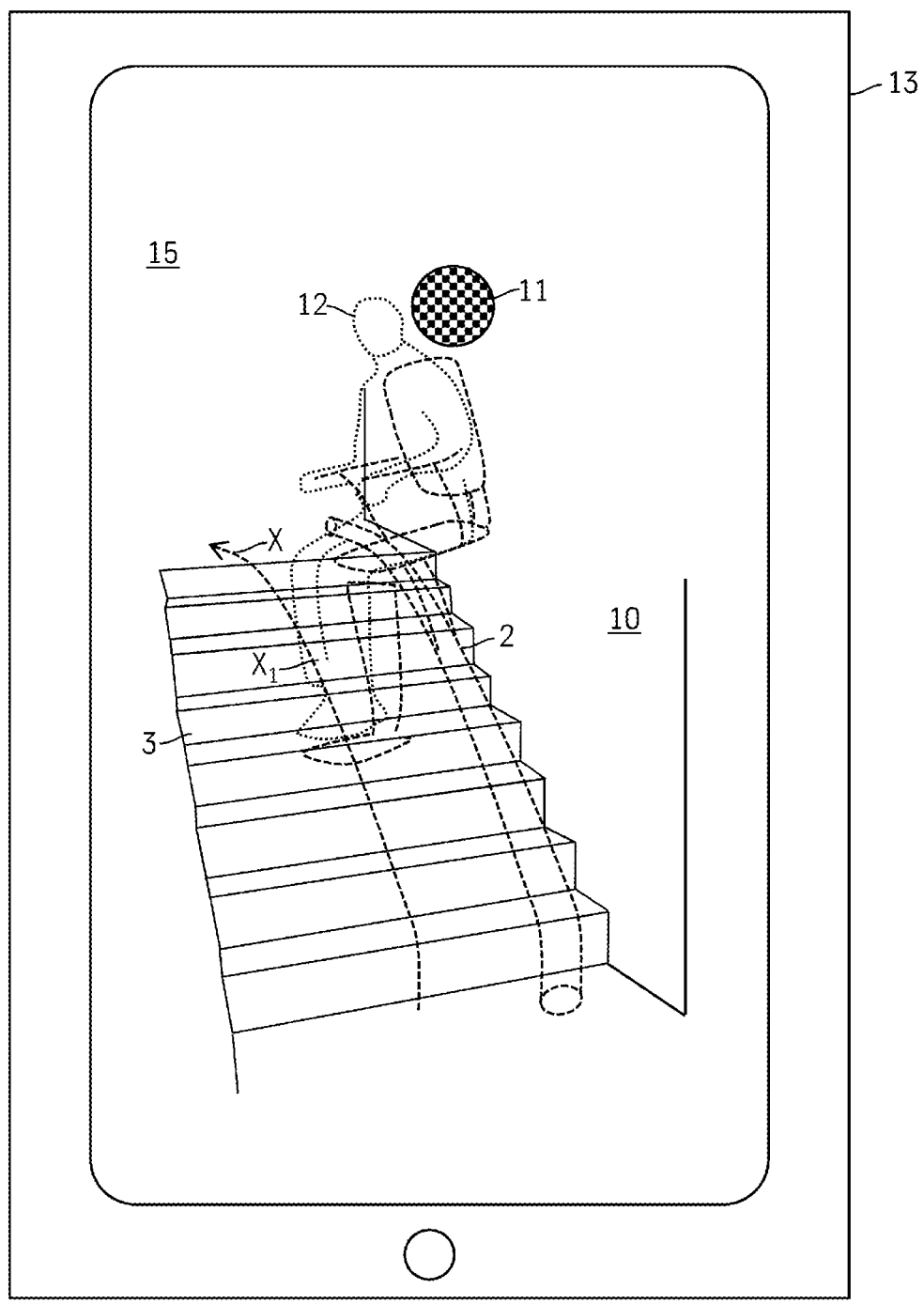
FIG. 9 is the visualization of FIG. 7 comprising a person sitting on the chair in the near of an obstacle.

FIG. 9 also shows a visualization of a virtual passenger 12 sitting on the seat 8, visualized by the display 15 of the virtual reality device 13. The stature of the passenger 12 can be changed by a user input and can be adapted to the real purchaser of the lift. With the help of the visualization of the passenger 12 sitting on the seat, it is possible to detect a virtual collision of the passenger 12 with a real obstacle 11. To avoid the collision both virtually and in the real world, the orientation of the platform 8 or the course of the path of travel D can be changed, as shown in FIG. 9. In this example, the virtual chair is a little bit tilted in the forward direction, so that the virtual head of the passenger 12 is not touching the real obstacle 11. This orientation is stored in a database and linked to the respective position $X_1$ along the rail.

During installation of the real platform lift, the geometric data of the path of travel, which was obtained in the previous method for planning, can be retrieved from a database and can be used to manufacture the rail. In another step the real stairlift can be programmed in a manner, that the real chair will perform the same orientation at the position $X_1$ as determined during the planning, so that a collision with the obstacle 11 is prevented during the usage of the real stairlift.

LIST OR REFERENCE SIGNS

1 platform lift
2 rail
3 stairs
4 first landing area
5 second landing area
6 drive unit
7 carrier
8 platform/seat
9 leveling mechanism
10 wall
11 obstacle
12 passenger (not the user)
13 augmented reality device/tablet PC
14 marker
15 display
16 camera
17 geometric triangle
D path of travel D
X position along path of travel
V vertical axis
H horizontal axis
C clearance parameter

What is claimed is:

1. A method of planning a platform lift at a stair, the platform lift comprising a rail, a platform, a drive unit attached to the platform and engaged with the rail to drive the platform along the rail, the method comprising:
    acquiring 3D-data of the stair on which the platform lift is to be installed utilizing an augmented reality device by,
        observing an area of the stair with the augmented reality device,
        marking several locations of the stair with markers and confirming the location of the markers via a user input, and
        extracting surface information via a computer-based analysis on the markers and the 3D-data acquired by the augmented reality device;
    calculating a path of travel of the rail based on the acquired 3D-data and predetermined clearance information; and
    visualizing, with the augmented reality device, at least part of the platform lift in accordance with the calculated path of travel; and
    bringing a visualization of parts of the platform lift, or a visualization of a person, into a zone of influence of a real obstacle, to determine whether a collision situation exists between the real obstacle and at least one of the visualization of parts or the visualization of a person, wherein the visualization of parts of the platform lift or the visualization of the person is in accordance with the path of travel.

2. The method of claim 1, including visualizing a platform and a seat along the calculated path with the augmented reality device.

3. The method of claim 1, including visualizing a passenger along the calculated path with the augmented reality device.

4. The method of claim 3, including visualizing the passenger along the visualized platform.

5. The method of claim 3 wherein a magnitude of the visualized person is adapted based on a user input.

6. The method of claim 1 wherein the platform and/or a person is visualized in various locations in accordance with the path of travel.

7. The method of claim 6, wherein the platform and/or the person is visualized in various orientations at the same location of the path of travel.

8. The method of claim 7 wherein the platform and/or the person is visualized swiveled around a vertical axis and/or tilted around a horizontal axis upon a user input.

9. A method of planning a platform lift at a stair, the platform lift comprising a rail, a platform, a drive unit attached to the platform and engaged with the rail to drive the platform along the rail, the method comprising:
    acquiring 3D-data of the stair on which the platform lift is to be installed utilizing an augmented reality device by,
        observing an area of the stair with the augmented reality device,
        marking several locations of the stair with markers and confirming the location of the markers via a user input, and
        extracting surface information via a computer-based analysis on the markers and the 3D-data acquired by the augmented reality device;
    calculating a path of travel of the rail based on the acquired 3D-data and predetermined clearance information;
    visualizing, with the augmented reality device, at least part of the platform lift in accordance with the calculated path of travel; and avoiding a collision between at least one real obstacle and at least one of a visualization of parts of the platform lift or a visualization of a person, by one or more of swiveling the visualization of the platform or the person around a vertical axis, or tilting the visualization of the platform or the person around a horizontal axis, upon a user input.

10. The method of claim 9, further comprising:
storing in a database, for each instance along the path of travel of the rail at which collision could occur between each real obstacle and one or more of the visualization of the parts of the platform lift or the visualization of the person,
   a location along the path of travel of the rail at which each collision could occur, and
   the respective tilting angle or a swivel angle to which the respective visualization of the platform or person should be rotated at such location in order to avoid collision with the respective real obstacle.

11. The method of claim 10 wherein the stored tilting angle or stored swivel angle is used during programming a control unit of the platform lift configured to control the tilting and swiveling of the platform during use.

\* \* \* \* \*